(12) United States Patent
Vash et al.

(10) Patent No.: US 8,943,379 B2
(45) Date of Patent: Jan. 27, 2015

(54) RETRY BASED PROTOCOL WITH SOURCE/RECEIVER FIFO RECOVERY AND ANTI-STARVATION MECHANISM TO SUPPORT DYNAMIC PIPELINE LENGTHENING FOR ECC ERROR CORRECTION

(75) Inventors: James R. Vash, Littleton, MA (US); Danielle N. Devereaux, Northborough, MA (US); Scott J. Erlanger, Boston, MA (US); Robert E. Faber, Milford, MA (US)

(73) Assignee: Intel Corporation, Santa Clara, CA (US)

(*) Notice: Subject to any disclaimer, the term of this patent is extended or adjusted under 35 U.S.C. 154(b) by 408 days.

(21) Appl. No.: 12/978,581

(22) Filed: Dec. 26, 2010

(65) Prior Publication Data

US 2011/0161769 A1    Jun. 30, 2011

Related U.S. Application Data

(60) Provisional application No. 61/290,206, filed on Dec. 26, 2009.

(51) Int. Cl.
| | |
|---|---|
| *H03M 13/00* | (2006.01) |
| *G06F 11/10* | (2006.01) |
| *H03M 13/37* | (2006.01) |
| *H04L 1/18* | (2006.01) |
| *G06F 11/14* | (2006.01) |

(52) U.S. Cl.
CPC .............. *G06F 11/10* (2013.01); *H03M 13/37* (2013.01); *H03M 13/3723* (2013.01); *H03M 13/6508* (2013.01); *H04L 1/1874* (2013.01); *G06F 11/1443* (2013.01)
USPC ........................................................ 714/751

(58) Field of Classification Search
USPC ........................................................ 714/751
See application file for complete search history.

(56) References Cited

U.S. PATENT DOCUMENTS

| | | | | |
|---|---|---|---|---|
| 5,265,103 | A * | 11/1993 | Brightwell | 714/748 |
| 6,101,168 | A * | 8/2000 | Chen et al. | 370/228 |
| 6,934,752 | B1 * | 8/2005 | Gubbi | 709/225 |
| 2002/0004842 | A1 * | 1/2002 | Ghose et al. | 709/235 |
| 2006/0179392 | A1 * | 8/2006 | Ota | 714/749 |
| 2006/0277434 | A1 * | 12/2006 | Tsern et al. | 714/17 |
| 2009/0313389 | A1 * | 12/2009 | McCabe et al. | 709/253 |
| 2009/0313519 | A1 * | 12/2009 | Nagaraja | 714/751 |

* cited by examiner

*Primary Examiner* — Michael Maskulinski
(74) *Attorney, Agent, or Firm* — Blakely, Sokoloff, Taylor & Zafman LLP (57) ABSTRACT

Methods and apparatus relating to retry based protocol with source/receiver FIFO (First-In, First-Out) buffer recovery and anti-starvation mechanism to support dynamic pipeline lengthening for ECC error correction are described. In an embodiment, upon detection of an error, a portion of transmitted data is stored in one or more storage devices before retransmission. Other embodiments are also described and claimed.

11 Claims, 5 Drawing Sheets

RETRY BASED PROTOCOL WITH SOURCE/RECEIVER FIFO RECOVERY AND ANTI-STARVATION MECHANISM TO SUPPORT DYNAMIC PIPELINE LENGTHENING FOR ECC ERROR CORRECTION

RELATED APPLICATION

The present application relates to and claims priority from U.S. Provisional Patent Application No. 61/290,206, filed on Dec. 26, 2009, entitled "RETRY BASED PROTOCOL WITH SOURCE/RECEIVER FIFO RECOVERY AND ANTI-STARVATION MECHANISM TO SUPPORT DYNAMIC PIPELINE LENGTHENING FOR ECC ERROR CORRECTION" which is hereby incorporated herein by reference in its entirety and for all purposes.

FIELD

The present disclosure generally relates to the field of electronics. More particularly, some embodiments of the invention relate to a retry based protocol with source/receiver FIFO (First-In, First-Out) buffer recovery and anti-starvation mechanism to support dynamic pipeline lengthening for ECC error correction.

BACKGROUND

Soft error rates in caches are increasing due to several factors, among them increasing cache sizes and increased "erratic bit" behavior in manufacturing processes. For this reason, some processors may utilize DECTED (Double-bit Error Correction, Triple-bit Error Detection) ECC (Error Correction Code) protection for the LLC (Last Level Cache).

One disadvantage of DECTED is that detection and correction are more expensive than SECDED (Single-bit Error Correction, Double-bit Error Detection) in terms of area, power, and/or latency. Also, as LLC hit latency may be critical to application performance, more efficient error correction may directly improve processor performance.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical items.

DETAILED DESCRIPTION

In the following description, numerous specific details are set forth in order to provide a thorough understanding of various embodiments. However, various embodiments of the invention may be practiced without the specific details. In other instances, well-known methods, procedures, components, and circuits have not been described in detail so as not to obscure the particular embodiments of the invention. Further, various aspects of embodiments of the invention may be performed using various means, such as integrated semiconductor circuits ("hardware"), computer-readable instructions organized into one or more programs ("software"), or some combination of hardware and software. For the purposes of this disclosure reference to "logic" shall mean either hardware, software, or some combination thereof. Also, even though some embodiments discussed herein may refer to a set or clear value as logical 0 and 1, respectively, these terms are interchangeable, e.g., depending on the implementation. Also, the use of "instruction" or "micro-operation" or "micro-op" (which may also be referred to as "uop") herein may be interchangeable.

As discussed above, LLC hit latency may be critical to application and processor performance. As a result, avoiding the latency penalty associated with ECC correction (except when an error is detected) may be imperative to satisfy both error rate and performance goals in processors.

Some embodiments provide a dynamic pipeline, e.g., in the context of a ring-based micro-architecture or, more generally, any shared interconnection network. In a ring-based micro-architecture, data to be sent from the LLC pipeline to receiver agents (e.g., processor core(s) or system interfaces) generally competes with traffic between other agents on a shared interconnection network. To reduce latency, both FIFO structures holding data from the LLC pipeline arbitrating for the ring interconnect and FIFO structures holding data received from the ring interconnect to be sent on the system interface cannot wait for information about whether an ECC error has been detected before advancing, in part, since this information may be known much later in the pipeline than FIFO arbitration (e.g., in a skewed pipeline). Therefore, a retry-based protocol and one or more associated FIFO buffer recovery mechanisms may be used in some embodiments to remove (or at least reduce) ECC detection latency from the critical path. Moreover, anti-starvation mechanisms for FIFO structures holding data from the LLC arbitrating for the ring interconnect may need to take into account the retry-based protocol as it may be contrary to the assumption that sending a message on the ring interconnect is a measure of forward progress. As discussed herein, the use of a "shared" interconnect and a "ring" interconnect may be interchangeable.

An embodiment provides a micro-architecture and protocol to implement dynamic pipeline lengthening (e.g., in the context of one or more FIFO buffers) upon the detection of an ECC error. This allows time for correction while interacting with a shared interconnect. For example, logic at source and receiver agents may be used to rewind and resend information after detection of an error (e.g., in response to occurrence of the error).

Figure 1:
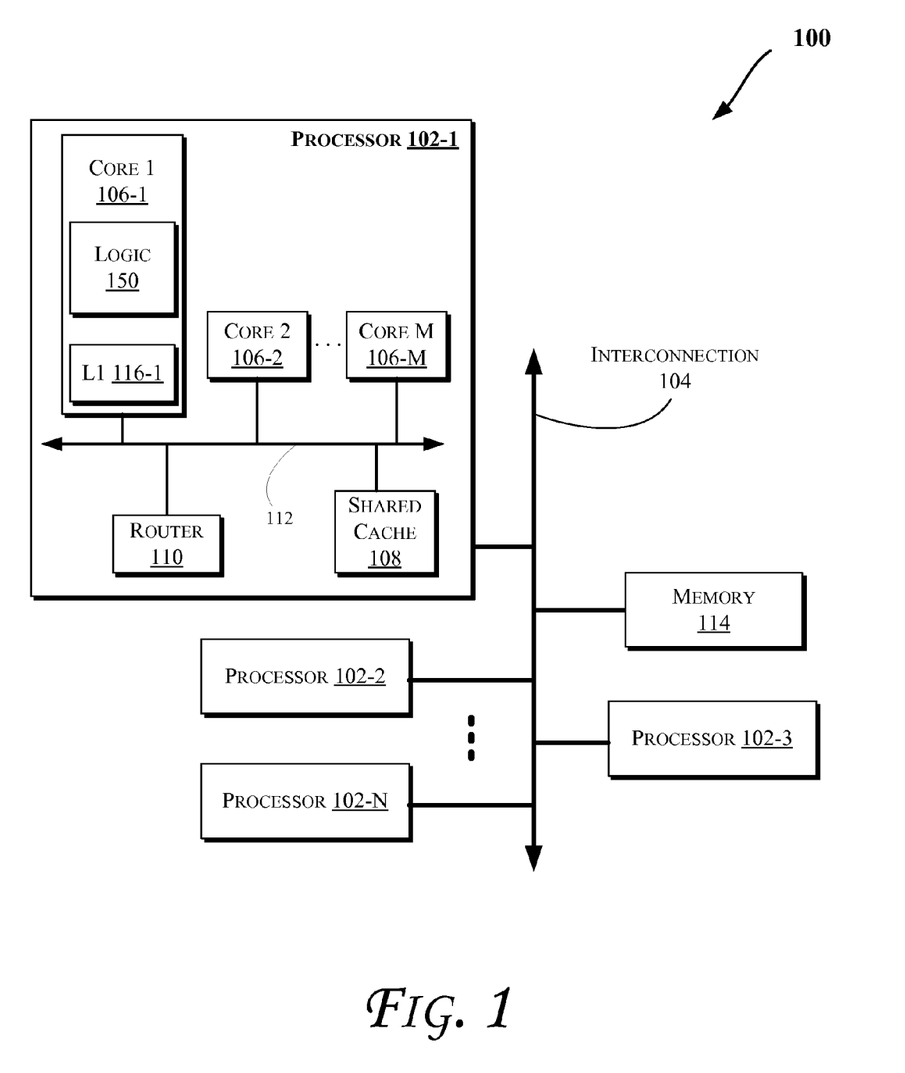
FIGS. 1 and 3-4 illustrate block diagrams of embodiments of computing systems, which may be utilized to implement various embodiments discussed herein.

Techniques described herein may allow for improved performance in various computing devices, such as those discussed for example with reference to FIGS. 1-5. More particularly, FIG. 1 illustrates a block diagram of a computing system 100, according to an embodiment of the invention. The system 100 may include one or more processors 102-1 through 102-N (generally referred to herein as "processors 102" or "processor 102"). The processors 102 may communicate via an interconnection network or bus 104. Each processor may include various components, some of which are only discussed with reference to processor 102-1 for clarity. Accordingly, each of the remaining processors 102-2 through 102-N may include the same or similar components discussed with reference to the processor 102-1.

In an embodiment, the processor 102-1 may include one or more processor cores 106-1 through 106-M (referred to herein as "cores 106" or more generally as "core 106"), a shared cache 108, and/or a router 110. The processor cores 106 may be implemented on a single integrated circuit (IC) chip. Moreover, the chip may include one or more shared and/or private caches (such as cache 108), buses or interconnections (such as a bus or interconnection network 112), memory controllers (such as those discussed with reference to FIGS. 3 and 4), or other components.

In one embodiment, the router 110 may be used to communicate between various components of the processor 102-1 and/or system 100. Moreover, the processor 102-1 may include more than one router 110. Furthermore, the multitude of routers 110 may be in communication to enable data routing between various components inside or outside of the processor 102-1.

The shared cache 108 may store data (e.g., including instructions) that are utilized by one or more components of the processor 102-1, such as the cores 106. For example, the shared cache 108 may locally cache data stored in a memory 114 for faster access by components of the processor 102. In an embodiment, the cache 108 may include a Mid-Level Cache (MLC) (such as a Level 2 (L2), a Level 3 (L3), a Level 4 (L4), or other levels of cache), a Last Level Cache (LLC), and/or combinations thereof. Moreover, various components of the processor 102-1 may communicate with the shared cache 108 directly, through a bus (e.g., the bus 112), and/or a memory controller or hub. As shown in FIG. 1, in some embodiments, one or more of the cores 106 may include a Level 1 (L1) cache (116-1) (generally referred to herein as "L1 cache 116") and/or an L2 cache (not shown).

Also, processor 102-1 may include a logic 150 to perform operations related to retry based protocol with source/receiver FIFO recovery and/or anti-starvation mechanism to support dynamic pipeline lengthening for ECC error correction, such as one or more of the operations discussed with reference the state machine of FIG. 5. For example, logic 150 may collectively refer to one or more logics including for example logic at source and/or receiver agents which may be used to rewind and resend information after detection of an error. Moreover, although logic 150 is shown to be inside core 106-1, logic 150 may be provided elsewhere in the system in various embodiments, such as in the router 110, in the shared cache 108, etc. (and communicating over the interconnect 112 in an embodiment) Also, in some embodiments, logic 150 (or any of its components discussed herein) may be shared amongst a plurality of processor cores or other computing device components.

Figure 2:
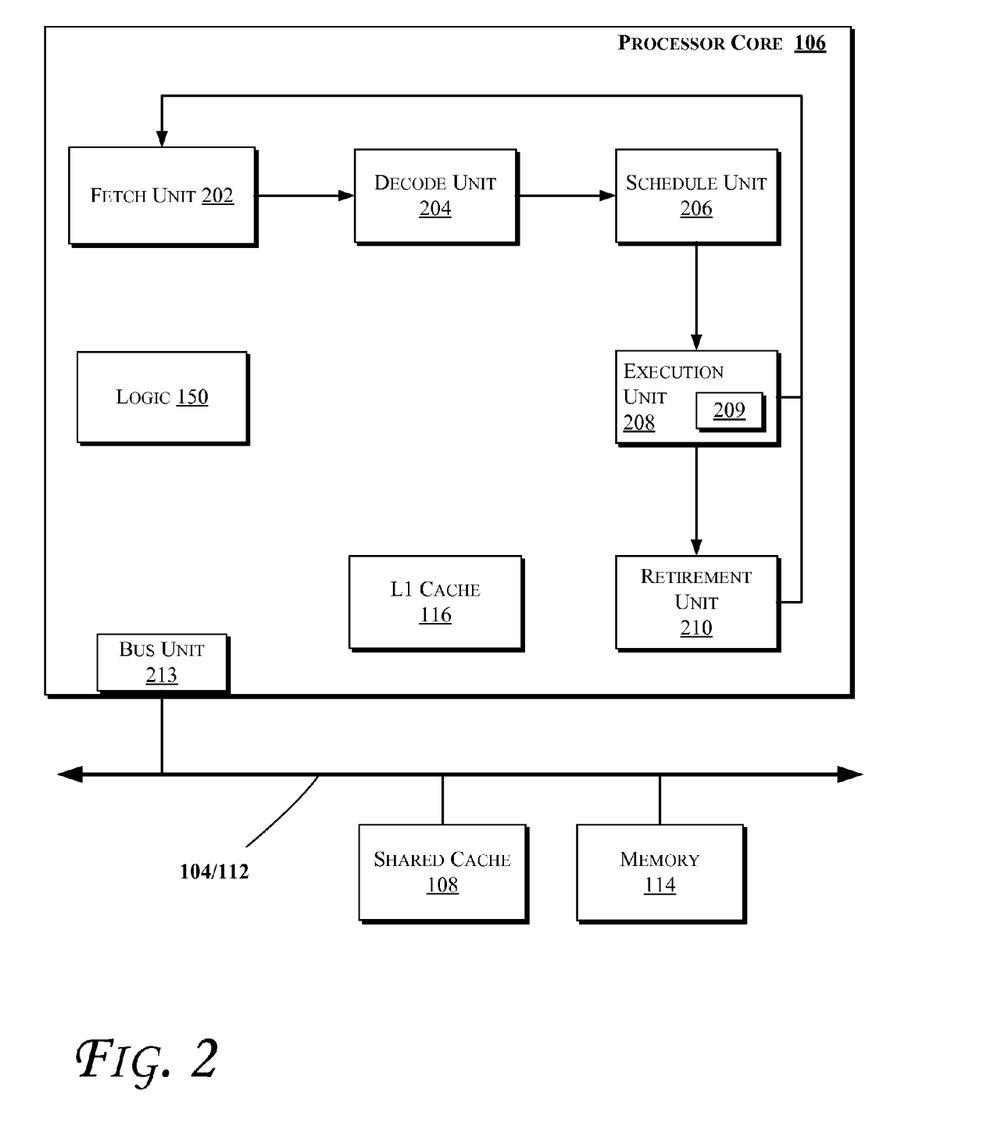
FIG. 2 illustrates a block diagram of portions of a processor core and other components of a computing system, according to an embodiment of the invention.

FIG. 2 illustrates a block diagram of portions of a processor core and other components of a computing system, according to an embodiment of the invention. In an embodiment, at least some of processors discussed herein (e.g., with reference to FIG. 1, 3, or 4) may include one or more of the component of the processor core 106 shown in FIG. 2. Also, a processor may include a single or multi-core 106, which may be homogeneous/symmetric or heterogeneous/asymmetric, etc. such as discussed herein, e.g., with reference to FIG. 1, 3, or 4. In one embodiment, the arrows shown in FIG. 2 illustrate the flow direction of instructions through the core 106. One or more processor cores (such as the processor core 106) may be implemented on a single integrated circuit chip (or die) such as discussed with reference to FIG. 1. Moreover, the chip may include one or more shared and/or private caches (e.g., cache 108 of FIG. 1), interconnections (e.g., interconnections 104 and/or 112 of FIG. 1), memory controllers, or other components.

As illustrated in FIG. 2, the processor core 106 may include a fetch unit 202 to fetch instructions for execution by the core 106. The instructions may be fetched from any storage devices such as the memory 114 and/or the memory devices discussed with reference to FIG. 3 or 4. The core 106 may optionally include a decode unit 204 to decode the fetched instruction. In an embodiment, the decode unit 204 may decode the fetched instruction into a plurality of uops (micro-operations). Some embodiments of the processor core 106 may not include decode unit 204. Hence, the core 106 may process instructions without decoding them. Additionally, the core 106 may include a schedule unit 206. The schedule unit 206 may perform various operations associated with storing decoded instructions (e.g., received from the decode unit 204) until the instructions are ready for dispatch, e.g., until all source values of a decoded instruction become available.

In one embodiment, the schedule unit 206 may schedule and/or issue (or dispatch) decoded instructions to an execution unit 208 for execution. The execution unit 208 may execute the dispatched instructions after they are dispatched (e.g., by the schedule unit 206) and, if applicable, decoded (e.g., by the decode unit 204). In an embodiment, the execution unit 208 may include more than one execution unit, such as one or more memory execution units, one or more integer execution units, one or more floating-point execution units (209), or other execution units. The execution unit 208 may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit 208.

Further, the execution unit 208 may execute instructions out-of-order. Hence, the processor core 106 may be an out-of-order processor core in one embodiment. The core 106 may also include a retirement unit 210. The retirement unit 210 may retire executed instructions (e.g., in order) after they are committed. In an embodiment, retirement of the executed instructions may result in processor state being committed from the execution of the instructions, physical registers used by the instructions being de-allocated, etc.

Figure 4:
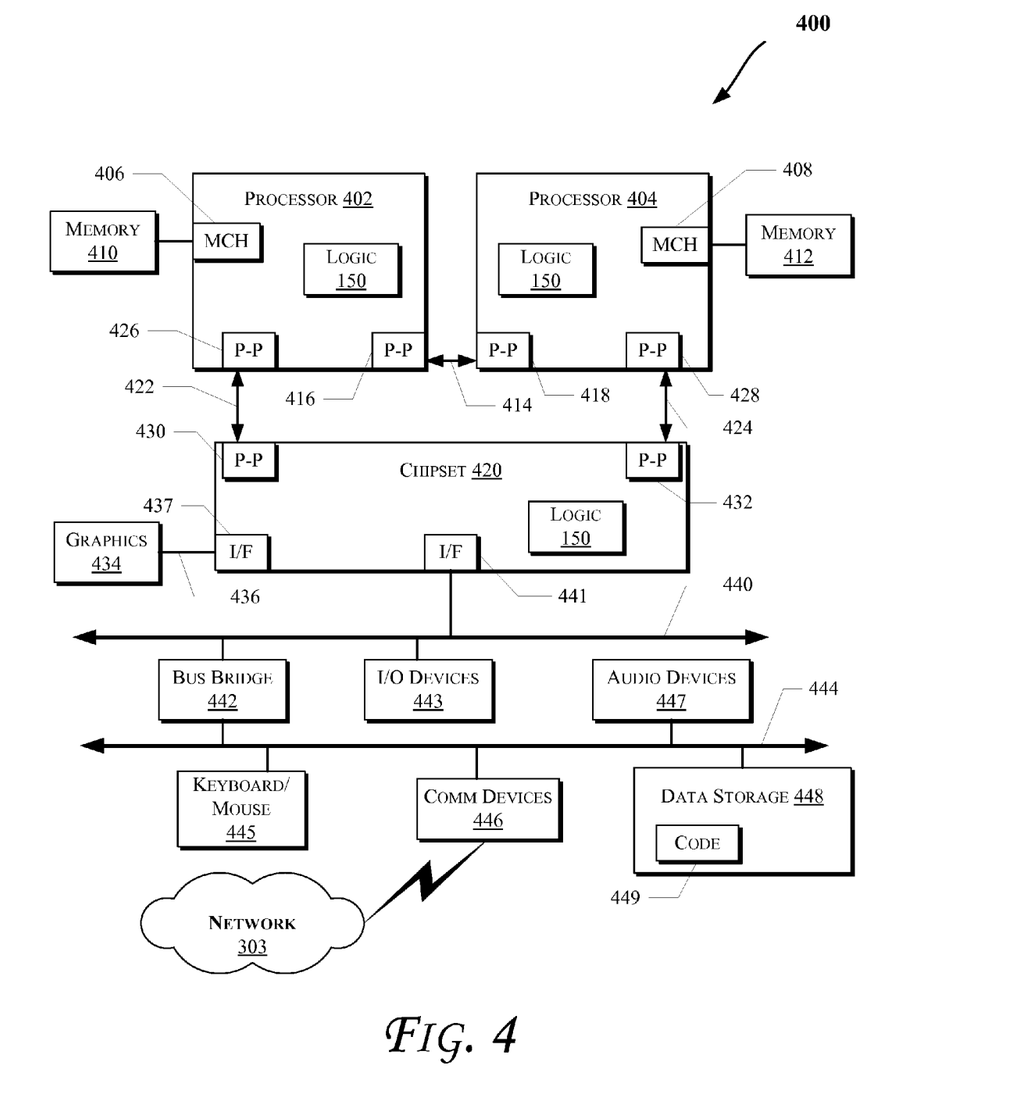
Figure 5:
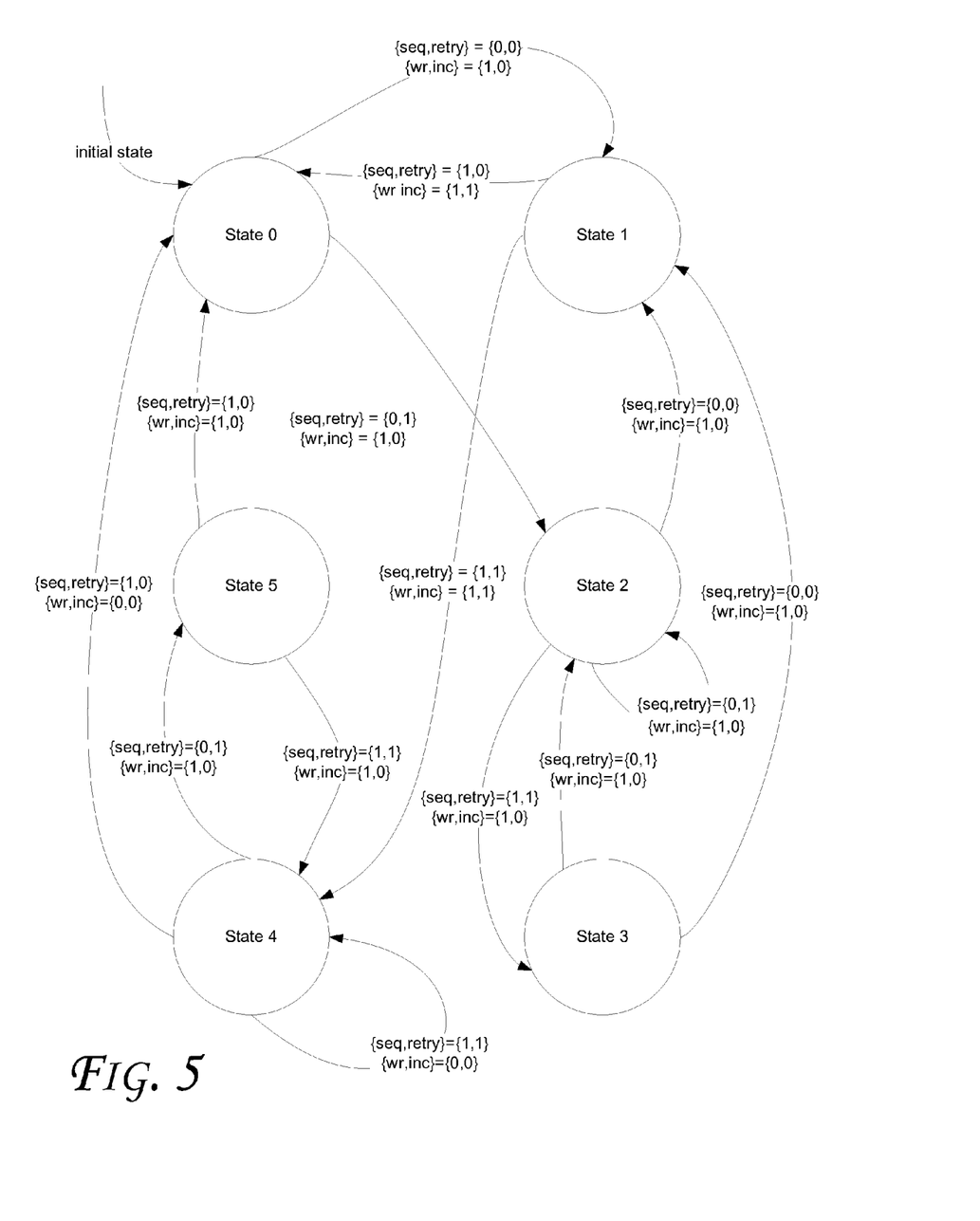
FIG. 5 illustrates a state machine diagram, according to an embodiment.

The core 106 may further include the logic 150 (such as the logic 150 of FIG. 1 which is further discussed herein, e.g., with reference to FIG. 5). Additionally, the core 106 may include a bus unit 213 to allow communication between components of the processor core 106 and other components (such as the components discussed with reference to FIG. 1, 3, or 4) via one or more buses (e.g., buses 104 and/or 112).

Figure 3:
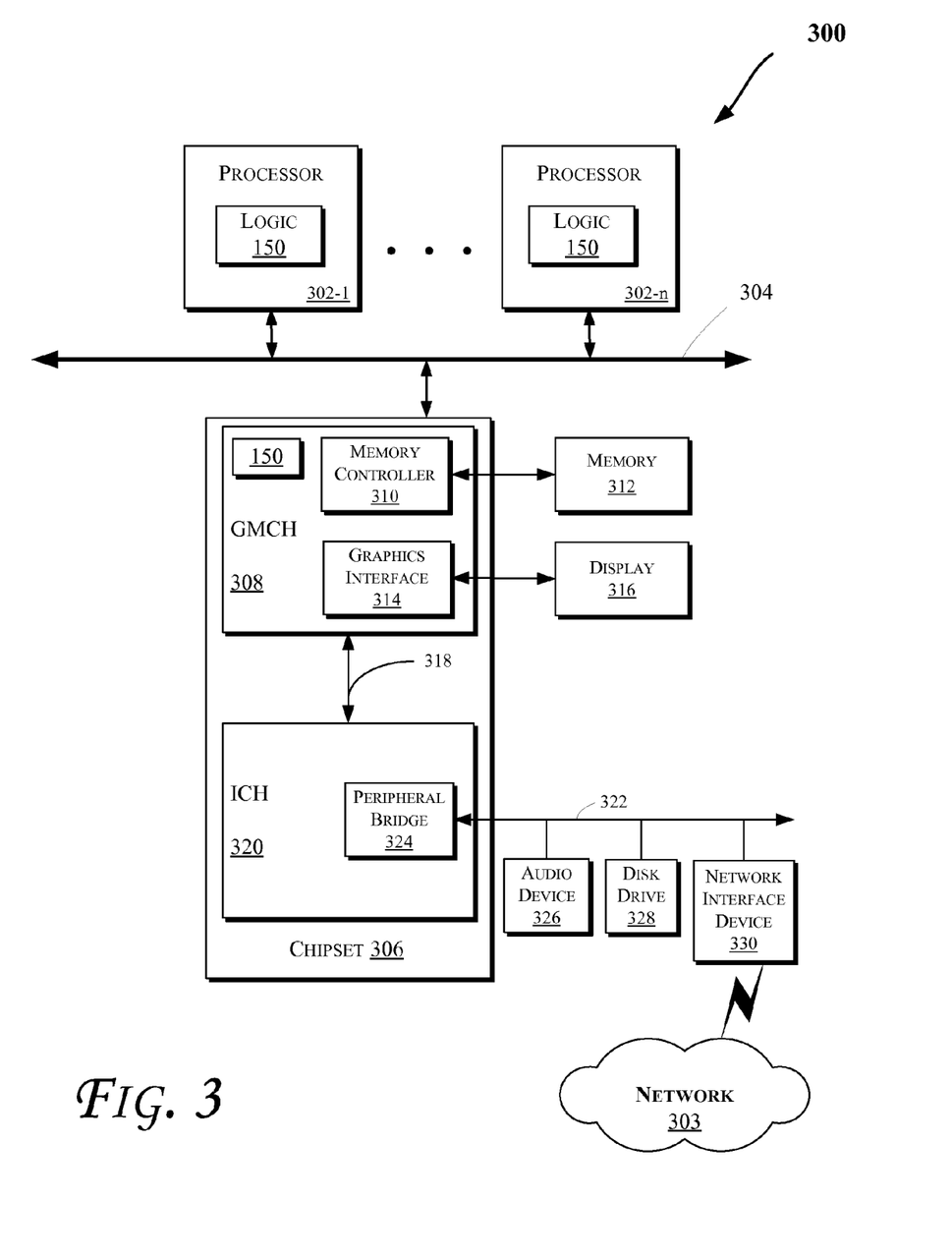

FIG. 3 illustrates a block diagram of a computing system 300 in accordance with an embodiment of the invention. The computing system 300 may include one or more central processing unit(s) (CPUs) 302 or processors that communicate via an interconnection network (or bus) 304. The processors 302 may include a general purpose processor, a network processor (that processes data communicated over a computer network 303), or other types of a processor (including a reduced instruction set computer (RISC) processor or a complex instruction set computer (CISC)). Moreover, the processors 302 may have a single or multiple core design. The processors 302 with a multiple core design may integrate different types of processor cores on the same integrated circuit (IC) die. Also, the processors 302 with a multiple core design may be implemented as symmetrical or asymmetrical multiprocessors. In an embodiment, one or more of the processors 302 may be the same or similar to the processors 102 of FIG. 1. For example, one or more of the processors 302 may include one or more of the caches, storage devices, and/or components of other figures, including for example, logic 150. Also, the operations discussed herein may be performed by one or more components of the system 300.

A chipset 306 may also communicate with the interconnection network 304. The chipset 306 may include a graphics and memory control hub (GMCH) 308. The GMCH 308 may include a memory controller 310 that communicates with a memory 312 (which may be the same or similar to the memory 114 of FIG. 1). The memory 312 may store data, including sequences of instructions, that may be executed by the CPU 302, or any other device included in the computing system 300. In one embodiment of the invention, the memory 312 may include one or more volatile storage (or memory) devices such as random access memory (RAM), dynamic RAM (DRAM), synchronous DRAM (SDRAM), static RAM (SRAM), or other types of storage devices. Nonvolatile memory may also be utilized such as a hard disk. Additional devices may communicate via the interconnection network 304, such as multiple CPUs and/or multiple system memories.

The GMCH 308 may also include a graphics interface 314 that communicates with a display device 316. In one embodiment of the invention, the graphics interface 314 may communicate with the display device 316 via an accelerated graphics port (AGP). In an embodiment of the invention, the display 316 (such as a flat panel display) may communicate with the graphics interface 314 through, for example, a signal converter that translates a digital representation of an image stored in a storage device such as video memory or system memory into display signals that are interpreted and displayed by the display 316. The display signals produced by the display device may pass through various control devices before being interpreted by and subsequently displayed on the display 316.

A hub interface 318 may allow the GMCH 308 and an input/output control hub (ICH) 320 to communicate. The ICH 320 may provide an interface to I/O device(s) that communicate with the computing system 300. The ICH 320 may communicate with a bus 322 through a peripheral bridge (or controller) 324, such as a peripheral component interconnect (PCI) bridge, a universal serial bus (USB) controller, or other types of peripheral bridges or controllers. The bridge 324 may provide a data path between the CPU 302 and peripheral devices. Other types of topologies may be utilized. Also, multiple buses may communicate with the ICH 320, e.g., through multiple bridges or controllers. Moreover, other peripherals in communication with the ICH 320 may include, in various embodiments of the invention, integrated drive electronics (IDE) or small computer system interface (SCSI) hard drive(s), USB port(s), a keyboard, a mouse, parallel port(s), serial port(s), floppy disk drive(s), digital output support (e.g., digital video interface (DVI)), or other devices.

The bus 322 may communicate with an audio device 326, one or more disk drive(s) 328, and a network interface device 330 (which is in communication with the computer network 303). Other devices may communicate via the bus 322. Also, various components (such as the network interface device 330) may communicate with the GMCH 308 in some embodiments of the invention. In addition, the processor 302 and other components shown in FIG. 3 (including but not limited to the GMCH 308, one or more components of the GMCH 308, etc.) may be combined to form a single chip. Furthermore, a graphics accelerator may be included within the GMCH 308 in other embodiments of the invention.

Furthermore, the computing system 300 may include volatile and/or nonvolatile memory (or storage). For example, nonvolatile memory may include one or more of the following: read-only memory (ROM), programmable ROM (PROM), erasable PROM (EPROM), electrically EPROM (EEPROM), a disk drive (e.g., 328), a floppy disk, a compact disk ROM (CD-ROM), a digital versatile disk (DVD), flash memory, a magneto-optical disk, or other types of nonvolatile machine-readable media that are capable of storing electronic data (e.g., including instructions).

FIG. 4 illustrates a computing system 400 that is arranged in a point-to-point (PtP) configuration, according to an embodiment of the invention. In particular, FIG. 4 shows a system where processors, memory, and input/output devices are interconnected by a number of point-to-point interfaces. The operations discussed herein may be performed by one or more components of the system 400.

As illustrated in FIG. 4, the system 400 may include several processors, of which only two, processors 402 and 404 are shown for clarity. The processors 402 and 404 may each include a local memory controller hub (MCH) 406 and 408 to enable communication with memories 410 and 412. The memories 410 and/or 412 may store various data such as those discussed with reference to the memory 312 of FIG. 3.

In an embodiment, the processors 402 and 404 may be one of the processors 302 discussed with reference to FIG. 3, e.g., including one or more of the caches discussed herein. The processors 402 and 404 may exchange data via a point-to-point (PtP) interface 414 using PtP interface circuits 416 and 418, respectively. Also, the processors 402 and 404 may each exchange data with a chipset 420 via individual PtP interfaces 422 and 424 using point-to-point interface circuits 426, 428, 430, and 432. The chipset 420 may further exchange data with a graphics circuit 434 via a graphics interface 436, e.g., using a PtP interface circuit 437.

At least one embodiment of the invention may be provided within the processors 402 and 404. For example, one or more of the cores 106 of FIG. 1 may be located within the processors 402 and 404. Also, processors 402 and 404 may include one or more of the caches, storage devices, and/or components discussed herein, e.g., logic 150. Other embodiments of the invention, however, may exist in other circuits, logic units, or devices within the system 400 of FIG. 4. Furthermore, other embodiments of the invention may be distributed throughout several circuits, logic units, or devices illustrated in FIG. 4.

The chipset 420 may communicate with a bus 440 using a PtP interface circuit 441. The bus 440 may communicate with one or more devices, such as a bus bridge 442 and I/O devices 443. Via a bus 444, the bus bridge 442 may communicate with other devices such as a keyboard/mouse 445, communication devices 446 (such as modems, network interface devices, or other communication devices that may communicate with the computer network 303), audio I/O device 447, and/or a data storage device 448. The data storage device 448 may store code 449 that may be executed by the processors 402 and/or 404.

In some implementations, for a (e.g., 64 B) cache line of data read from the LLC, there are two ring messages created (e.g., each carrying 32 B of data). Each message may consist of a destination field, header field, and data field. The header may contain a "poison" bit that is set when there is an uncorrectable ECC error. The data may contain a "retry" bit that is set when there is an ECC error detected, and the pipeline may be lengthened in order to attempt correction.

The source FIFOs that store these messages may share a single copy of the destination and header between both messages in an embodiment. The destination is written to the FIFO one cycle before the header, which in turn is written two cycles before the data (e.g., in a skewed pipeline). This timing alignment of the destination, header, and data is maintained when the message is sent on the ring. However, the embodiments are not limited to the aforementioned specific number of cycles and instead the destination may be written to the FIFO before the header and the header may be written to the FIFO before the data. Along with the FIFO read pointer, there may be a single "half" bit per FIFO which indicates which half cache line or 32 B of the 64 B cache line is currently being read. In an embodiment, the FIFO entry is only deallocated, and the read pointer advanced, after the second half is sent on the ring.

In some current implementations, each sending agent may have five FIFOs; four FIFOs to service data destined for some subset of the (e.g., eight) processor cores, and one FIFO to service data destined for the system interface. Each FIFO may have a two-cycle arbitration loop. Further, a new 64 B cache line may be written into one of the FIFOs only once every two cycles (actually, one 32 B half cache line may be written into one of the FIFOs per cycle; one cache line will be written in back-to-back cycles, three and four cycles after the destination, respectively).

There may also be a "zero-cycle" and/or "one-cycle" bypass of the FIFOs. The zero-cycle bypass allows a message to be sent on the ring at the same time it is written into the FIFO. The one-cycle bypass allows a message to be sent on the ring one cycle after it is written into the FIFO. The minimum latency through the FIFO without the bypass may be two cycles in an embodiment. Bypassing may be enabled when all relevant FIFOs' "valid counters" are zero, and bidding is enabled when the relevant FIFO valid counter is non-zero.

In some embodiments, ECC error detection may not occur until the first half of the data is ready to be written into the FIFO, which is three cycles after the first possible dispatch of an associated message onto the ring, e.g., due to the skewed pipeline. When an ECC error is detected, the LLC pipeline is prevented from generating further data messages for a window of four cycles. However, this takes three more cycles to take effect. During this six cycle "retry window", due to the two-cycle arbitration loop, each FIFO may have up to three ring messages (32 B half cache line each) that could have been sent. The FIFO logic needs to recover in order to resend these messages. The exact cycle counts in an embodiment are not material to the existence of a retry window created by the skewed pipeline between FIFO arbitration and ECC error detection and by the delay until further data messages cease after the error is detected.

There are several components that may be use in order to achieve this at the sender as follows:
1. In the datapath, a retry bit may be sent along with certain data going onto the ring within the retry window. For the first cycle of the retry window, only zero-cycle bypass data has the retry bit set; this may be the data with the ECC error. For the second cycle, only first half one-cycle bypass data has the retry bit set; this may be the data with the ECC error. For subsequent cycles, all outgoing data has the retry bit set. Data that is dispatched to the ring with the retry bit in these later cycles due to being in the retry window is said to be in the "retry shadow". Setting it for all outgoing data in later cycles avoids needing to keep track of which other FIFO(s) had an ECC error during the retry window and simplifies the recovery mechanism.
2. The source for writing the data portion of the FIFOs switches from the "short path" (before correction) to the "long path" (after correction), for the duration of the retry window, after a delay of three cycles. This may add three stages to the data pipeline.
3. The controls (write enable, write pointer, write half) for the data portion of the FIFOs are switched to versions delayed by three pipeline stages to align with the "long path" data, for the duration of the retry window, after a delay of three cycles.
4. The FIFO credit returns upstream to the LLC pipeline are suppressed for the duration of the retry window, after a delay of two cycles. In one embodiment, a credit for a FIFO entry that experiences retry due to an ECC error cannot be returned until two cycles after the retry has been detected. This is because an ECC error is detected relative to the first half of the data, and the second half may be sent onto the ring (and the FIFO credit returned) a minimum of two cycles later, due to the two cycle arbitration loop of each FIFO. The design may also result in a FIFO entry only experiencing retry due to being in the retry shadow starting two cycles later relative to the ECC error. Therefore, FIFO credit return suppression avoids impacting the latency of the FIFO credit returns.
5. The bypass (zero-cycle and one-cycle) enables, bid enables, and read enables are suppressed for the duration of the retry window, after a delay of four cycles.
6. Upon a retry, for any FIFO that is not empty, a flag may be set indicating that a retry occurred since the last FIFO credit return, indicating that basic anti-starvation invariants may have been violated. The flag may be cleared on the next FIFO credit return, signifying that true forward progress has been made.
7. The LLC pipeline is prevented from generating further data messages for four cycles immediately following the six cycle "retry window". This allows time to switch back to the "short path".
8. A count of how many messages were dispatched within the retry window is retained for each FIFO. For the first cycle of the retry window, this may only count zero-cycle bypass dispatches. For the second cycle, this may only count one cycle bypass dispatches. For subsequent cycles, this may count any dispatch. This feature ensures the count is kept consistent with the datapath behavior. The count may actually be a maximum of two (not three) since bypass is disabled starting from the third cycle of the retry window, and if the count becomes one during the first two cycles of the retry window (via bypass) then no FIFO dispatch may occur during the third or fourth cycle.
9. At the end/expiration of the retry window, the count for each FIFO may be used to rewind the FIFO valid counters, read pointers, and/or half bits. If the count is one, the half bit is flipped, and if the half bit was zero, the valid counter is incremented by one and the read pointer is decremented by one. If the count is two, the half bit is not flipped, the valid counter is incremented by one, and the read pointer is decremented by one.
10. Periodically (e.g., based on a free-running counter), one or more flags indicating that a retry occurred since the last FIFO credit return may be checked. If any are non-zero, the LLC pipeline may be prevented from generating further data messages until the flags are all non-zero. This in turn may prevent the pathological case where one FIFO continually makes false "forward progress" in the "retry shadow" of other FIFOs which have retries due to ECC errors.

FIG. 5 illustrates a state machine according to an embodiment. In some embodiments, how the receiver recovers from a retry depends on the requirements at the receiver. For some processors, this may be handled in different ways at the core versus the system interface. At the core, there is time in the pipeline to use the retry bit from the data to shoot down the valid bit of the message before it reaches the core. This is because valid bit and data payload need to be aligned due to the frequency domain crossing between uncore and core. So in the case of the core, no other special recovery mechanism is needed due to the retry. However, at the system interface, the two 32 B data messages for a 64 B cache line, along with a corresponding header message carrying address and other information, may need to be reassembled before the message is packetized into flits to send on the interconnect link (such a QPI [Quick Path Interconnect]; as discussed herein, where the use of term QPI is intended to refer to any type of an point-to-point processor interconnect). Furthermore, similar to the FIFO structures at the sender, there may be FIFO structures at the system interface receiver where write allocation (including updating of write pointers and half bits) is done early in the pipeline with respect to when data arrives with a retry indication in order to assemble the message as quickly as possible for sending on the link.

In one embodiment, due to the recovery mechanism at the sender, and retry bits being set on data that is in the retry window (in addition to being set on data which actually has an ECC error), there may be several different potential interleaving of retry and non-retry data messages from a particular sender FIFO to a matching receiver FIFO.

For example, one embodiment drops data with retry set. To implement this, two items may be used: (1) One bit per FIFO is used to block the increment of the write pointer upon receipt of the next message. This bit is set when receiving data with the retry bit set and is cleared when receiving data with the retry bit clear for a "first half" data message only; and (2) If two consecutive "second half" data messages are received for the same FIFO, the second one is not written to the receiver FIFO.

Moreover, one may enumerate all the potential combinations of first and second half data sent with retry set or not set. This may be done in the form of a state machine (such as the state machine of FIG. 5). As shown in FIG. 5, there are a total of six states, two inputs (sequence (half), retry), two outputs (write, increment), and 14 arcs. This evaluation assumes that the interconnection network keeps messages in order between the sender and receiver.

The normal value of the "write" output may always be one; that is, always write. The normal value of the "increment" output is equal to the "sequence" input; that is, increment the write pointer after receiving a "second half" data message.

In FIG. 5, the states are as follows in accordance with some embodiments. State 0 is the initial state. From here, inputs $\{0,0\}$ or $\{0,1\}$ may be received. Output is normal in either case. The former goes to state 1, the latter to state 2. State 1 is after receiving a non-retry first half $\{0,0\}$. From here, inputs $\{1,0\}$ or $\{1,1\}$ may be received. Output is normal in either case. The former goes to state 0, the latter to state 4. Note that in the latter case, the write pointer may be incremented even though the data is marked as retry. This is acceptable since the only case in which a second half data may be marked retry when the corresponding first half was not, is when the second half is in the "retry shadow" at the sender, and so does not actually have an ECC error.

State 2 occurs after receiving a retry first half $\{0,1\}$. From here, inputs $\{0,0\}$, $\{0,1\}$, or $\{1,1\}$ may be received. The first goes to state 1, the second remains in state 2, and the third goes to state 3. Output is normal, except for the third case, where the write pointer increment is blocked, since a retry was previously received without an intervening first half non-retry.

State 3 occurs after receiving a retry first half $\{0,1\}$ followed by a retry second half $\{1,1\}$. From here, inputs $\{0,0\}$ or $\{0,1\}$ may be received. Output is normal in either case. The former goes to state 1, the latter to state 2. This state could be collapsed to state 0, but is kept separate for clarity, since it is reached by receiving retry data.

State 4 occurs after receiving a retry second half $\{1,1\}$ due to "retry shadow", which caused the write pointer to be incremented to the next entry. From here, inputs $\{1,0\}$, $\{1,1\}$, or $\{0,1\}$ may be received. The first goes to state 0, the second remains in state 4, and the third goes to state 5. For the first two cases, both the write and increment are blocked. The write is blocked since a second half was received immediately following another second half. The increment is blocked since a retry was previously received without an intervening first half non-retry. For the last case, output is normal; the write does not need to be blocked, since receiving a first half message means that the sender has a credit and thus the FIFO may not be full.

State 5 occurs after receiving a retry first half $\{0,1\}$ due to a "retry shadow", with the write pointer still advanced by an entry. From here, inputs $\{1,0\}$ or $\{1,1\}$ may be received. The first goes to state 0, the latter to state 4. In either case, the increment may be blocked, since a retry was previously received without an intervening first half non-retry. Again, write does not need to be blocked, since previous receipt of a first half message means that the sender has a credit and thus the FIFO may not be full.

Accordingly, some embodiments support a dynamic pipeline with a retry-based mechanism that works in the context of a skewed (between control and error detection) pipeline, on a shared interconnection network. In one embodiment, a retry recovery mechanism may be used for source and receiver FIFOs, plus an anti-starvation mechanism for the source FIFO.

Furthermore, at least some embodiments may provide one or more of the following:
1. Accommodation of a skewed pipeline (delay between arbitration pipeline and error detection).
2. Accommodation of a shared interconnect that requires source/receive FIFOs for data transfer.
3. A retry mechanism with special support at source and receiver to recover while maintaining a FIFO semantic.
4. An anti-starvation mechanism to guarantee forward progress in the presence of marking data messages as retried even when they do not have an error ("retry shadow"), which may have been done to simplify FIFO recovery.

In various embodiments of the invention, the operations discussed herein, e.g., with reference to FIGS. 1-5, may be implemented as hardware (e.g., logic circuitry), software, firmware, or combinations thereof, which may be provided as a computer program product, e.g., including a machine-readable or computer-readable (e.g., non-transitory) medium having stored thereon instructions (or software procedures) used to program a computer to perform a process discussed herein. The machine-readable medium may include a storage device such as those discussed herein.

Additionally, such tangible (e.g., non-transitory) computer-readable media may be downloaded as a computer program product, wherein the program may be transferred from a remote computer (e.g., a server) to a requesting computer (e.g., a client) by way of data signals in a propagation medium via a communication link (e.g., a bus, a modem, or a network connection).

Reference in the specification to "one embodiment," "an embodiment," or "some embodiments" means that a particular feature, structure, or characteristic described in connection with the embodiment(s) may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments of the invention, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although embodiments of the invention have been described in language specific to structural features and/or methodological acts, it is to be understood that claimed subject matter may not be limited to the specific features or acts described. Rather, the specific features and acts are disclosed as sample forms of implementing the claimed subject matter.

The invention claimed is:

1. An apparatus, comprising:
a processor having a cache, a plurality of processing cores and a network between said cache and said processing cores, said cache to provide cached data to any of said processing cores, wherein, circuitry to send cached data to its respective processing core includes an ECC unit, a buffer and a bypass that circumvents said buffer, said buffer to queue requested cached data and its destination and header information between said cache and said network, said bypass to send said requested cached data's destination and header information to its respective processing core without delay imposed by said buffer, wherein, upon said ECC unit providing an indication that said requested cached data is corrupted after it is too late to prevent said requested cached data's destination and header information from being sent into said network, said circuitry:
marks said requested cached data with a retry bit and forwards said requested cached data towards said network; and
prevents other requested cached data from being entered into said buffer for a predetermined number of cycles following said indication.

2. The apparatus of claim 1 wherein said requested data is permitted to enter said network with said retry bit having been set.

3. The apparatus of claim 2 wherein said network is a ring.

4. The apparatus of claim 3 wherein said requested data is shot down before reaching its respective core, where, said respective data does not pass through a system interface.

5. The apparatus of claim 2 wherein said requested data is sent toward a system interface that includes a point-to-point link from said processor to another processor, said requested data being shot down at said system interface.

6. The processor of claim 1 wherein said cache is a last level cache.

7. The processor of claim 1 wherein said circuitry includes a second bypass that permits second requested cached data's destination and header information to be sent into said network after a delay imposed by said buffer that is less than a nominal delay of said buffer, said circuitry to mark said second requested cached data with a retry bit if said indication was raised after it was too late to prevent said second requested cache data's destination and header information from being sent into said network.

8. A method, comprising:
processing requested cached data at a cache end by:
sending destination and header information for said requested cache data into a network by by-passing a buffer designed to impose delay between a cache where said requested cache data is cached and said network;
raising an indication that said requested cache data is corrupted after it is too late to prevent said sending;
marking said requested cached data with a retry bit and forwarding said requested cached data toward said network;
preventing other requested cached data from entering said buffer for a predetermined number of cycles after said raising.

9. The method of claim 8 further comprising sending said requested cache data into said network.

10. The method of claim 8 wherein said cache is a last level cache.

11. The method of claim 8 further comprising:
permitting second requested cached data's destination and header information to be sent into said network after a delay imposed by said buffer that is less than a nominal delay of said buffer;
marking said second requested cached data with a retry bit if said indication was raised after it was too late to prevent said second requested cache data's destination and header information from being sent into said network.

* * * * *